United States Patent [19]
Keller

[11] Patent Number: 5,700,037
[45] Date of Patent: Dec. 23, 1997

[54] SECURITY IMPROVED CARD

[76] Inventor: John A. Keller, 37 79th St., Sea Isle, N.J. 08243

[21] Appl. No.: 587,335

[22] Filed: Jan. 16, 1996

[51] Int. Cl.⁶ ............................................. B42D 15/10
[52] U.S. Cl. ........................ 283/107; 283/108; 283/109; 283/99; 283/106; 283/904; 283/901; 283/74
[58] Field of Search .................................. 283/107, 108, 283/109, 110, 111, 904, 112, 901, 99, 91, 92, 93, 94, 74, 75, 77, 86

[56] References Cited

U.S. PATENT DOCUMENTS

| | | | |
|---|---|---|---|
| 2,568,427 | 9/1951 | Wolowitz | 283/904 X |
| 3,245,698 | 4/1966 | Nugent | 283/904 X |
| 3,565,463 | 2/1971 | Taylor | 283/109 X |
| 3,583,317 | 6/1971 | Gibson | 283/904 X |
| 3,605,619 | 9/1971 | Gilstrap | 283/904 X |
| 3,810,566 | 5/1974 | Adams et al. | 283/904 X |
| 3,827,726 | 8/1974 | McVoy et al. | 283/109 X |
| 4,109,047 | 8/1978 | Fredrickson | 283/904 X |
| 4,562,342 | 12/1985 | Solo | 235/380 |
| 4,645,701 | 2/1987 | Zarrow | 428/120 |
| 4,824,144 | 4/1989 | Tasma | 283/114 X |
| 5,096,228 | 3/1992 | Rinderknecht | 283/904 X |
| 5,171,039 | 12/1992 | Dusek | 283/75 |
| 5,215,334 | 6/1993 | Presson et al. | 283/904 X |
| 5,308,121 | 5/1994 | Gunn | 283/99 |
| 5,326,964 | 7/1994 | Risser | 283/99 X |
| 5,360,655 | 11/1994 | McDonald | 428/121 |
| 5,380,046 | 1/1995 | Stephens | 283/75 |
| 5,434,405 | 7/1995 | Finkelstein et al. | 283/109 X |

FOREIGN PATENT DOCUMENTS

| | | | |
|---|---|---|---|
| 1-171991 | 7/1989 | Japan | 283/114 |
| 2236279 | 4/1991 | United Kingdom | 283/74 |

Primary Examiner—Andrea L. Pitts
Assistant Examiner—Julie A. Krolikowski
Attorney, Agent, or Firm—Lennox & Murtha, P.A.

[57] ABSTRACT

A security improved credit, debit, pass, or cash card is a colorless and transparent semirigid plastic card member with non reflective faces, with no permanent imprinting on the card member to visually identify an issuer, an owner or a card number, but with temporary identification that can be removed by the owner of the card and can be visually read only when backed by an opaque sheet. The card has a bending line across a face of the card member that is a slit through the card with a hinge of flexible plastic film attached over the slit. The card has an opening cut through the card member to allow a person's finger nail to engage the opening to pull the card from a wallet or to attach the card on a shirt button.

32 Claims, 3 Drawing Sheets

SECURITY IMPROVED CARD

BACKGROUND OF THE INVENTION

This invention involves a more secure form of a financial or entry card and, more particularly, to reduce the storage size of the card.

The use of credit and debit cards is commonplace among persons involved in all types of financial transactions. Credit cards are issued providing each card with a specific identification number assigned to the card owner. The card can be visually identified not only by the number, the name of the card owner, and other information such as expiration date, the date of joining the credit plan, and the like. Debit cards are issued by banks to allow charging directly to a checking account or a savings account in the institution. Automatic Teller Machine cards are used to withdraw cash from the bank using electronic tellers. Newer "money cards" are issued with no value until moneys are paid by the card owner to the issuer of the card at which time the electronic code on the card is changed to reflect the balance of purchasing power up to that limit, such as, for telephone calls and the like. At each purchase, that amount is reduced until the amount originally paid has been dissipated. Entry or pass cards are used in hotels and high security buildings in place of keys. Expansion of the use of the entry cards in residential buildings and motor vehicles is likely. All of these cards have or can have a common size and thickness and all contain a magnetic strip tape imprint bearing ferrous metal particles in a vehicle to hold the particles which are capable of encoding a readable message, some with the capability of changing that information as the card is used. That magnetic strip imprint is referred to herein as the magnetic strip. The strips in present use may include a plurality of tracks and may be positioned anywhere on the one half of the card that is not reserved for the raised letters of the owner's name, card number, and other indicia. When presented with a credit or debit card, a vendor electronically verifies the credit card number and the limit of credit or debit of that particular card. Upon receiving authorization to proceed with the sale, the vendor inserts the card into a device which reads the information from the magnetic strip and a charge slip is printed out for the customer's signature.

Despite the proliferation of these cards, a number of handling and security problems exist. Although the card almost always includes raised letters and numbers to identify the owner, the card number, and the expiration date, almost all charges use card readers that use only the magnetic strip. The code on the magnetic strip can be damaged if it comes into proximity with a magnetically charged body. It is not uncommon for the card to be rendered useless to the owner at a most inopportune time. Further, handling and security of the cards is made difficult, particularly when the person is carrying a large number of cards. The space requirement of the card which is about thirty mils thick with overall dimensions three and three-eighths inches long and two and one eighth inches wide. Commonly, the cards become tightly packed into a wallet or holder and are difficult to locate and remove. It is not uncommon for a person to have to pull out a whole handful cards and sort through them for use. This procedure poses substantial security problems as an unscrupulous persons can easily see the card and the number during the process. Further, it is not always convenient to store the card in a pocket in a wallet, or the like. Unfortunately, the size of the card makes such storage in other locations inconvenient or possibly unsafe. If the credit card is merely kept in a person's pocket, it is subjected to continued abrasion and possible damage to the magnetic strip. While replacement of damaged cards is an inconvenience, damage to a strip which has been credited with a certain amount of money, could be a large financial loss. What is needed is a way to protect the card and allow it to be stored in a secure and easily accessible location. The size of the shape of the present credit card militates against that capability.

A further security problem with the use of financial cards occurs during the time the card is being removed from the wallet and when it is being used. This "window of opportunity" is used by criminals to take use of the card either by taking the card or by merely taking information from the card. A common procedure by unscrupulous individuals is to read the number and name from the card using sophisticated telescopic equipment. For example, a telephone charge card number can be used for many calls without the owner losing the card and before the authorization can be canceled. With the card number and owner's name items can be charged by telephone without the card by unauthorized persons. Also during the this "window" the process of removing card from the wallet or purse places the wallet and the purse in jeopardy. Anything that will reduce the time of the "window" or essentially eliminate the "window" will make the criminal's task that much harder.

Improved security of financial cards directed to the physical improvements has not been addressed in the prior art. U.S. Pat. No. 4,562,342 describes a card with a plurality of foldable corner tabs. In U.S. Pat. No. 5,308,121 to Gunn, a credit/service card that is full size and has a hinge along one edge to connect a second full card with attachments to hold the halves together. In U.S. Pat. No. 5,171,039 to Dusek, a medical information card is a series of cards attached along hinged edges so that it can be folded into a full credit card size.

None of these devices address the problems and needs described above nor do they attain the objects of the invention described herein below.

SUMMARY OF INVENTION

Throughout the Specification and Claims the term "card" is intended to refer to any card that, through its use, affects the financial condition of a holder of the card and includes credit cards, debit cards, and money cards, wherein the magnetic strip is coded with a certain amount of money which when used is reduced by the appropriate amount, as well as pass or entry cards to buildings, rooms, automobiles, medical services, and the like, as well as any other like use such as personal ID. cards.

It is an overall object of the protection sought to provide a card with improved convenience of use, safety, and security.

It is a further object of the protection sought to provide increased card security by allowing the card to be kept in a smaller place by allowing the card to be folded.

It is an additional object of the protection sought to provide a card that can be stored in less obvious places for quicker access.

It is a specific object of the protection sought to provide a card which may be hidden in the palm of the hand; in a waist belt; in a watch pocket; such as found in jeans, men's pants and shorts; in insteps in footwear, such as sneakers; in a guard dog collar; and as a key chain fob provided as a container for the new foldable credit card; as well as like locations and devices.

It is an object of the protection sought to provide a card that can be folded from an original area over seven square inches to a folded shape less than two and one-half square inches in one embodiment and in an alternative embodiment to a strip less than three-quarters of an inch in width.

It is a further object of the protection sought to provide a card which can be more easily removed from a tightly packed wallet containing a multiplicity of credit cards.

It is an additional object of the protection sought to provide a card which can be identified from its edge while in a tightly packed wallet.

It is a further object of the protection sought to provide a card which can be readily attached inside clothing to a button for convenience and, particularly for children with a money card.

It is a particular object of the protection sought to provide a nail access slot in the card to ease its removal from a packet of cards preferably with a complimentary notch to aid access to nail slot.

It is a particular object of the protection sought to provide means of protecting the magnetic strip from possible damage due to scratching or contact with a magnetic object.

It is a further object of the protection sought to provide an improved security card that will allow multiple uses of a single card such as a credit card, a money card, a medical coverage card and a pass card.

It is an object of the protection sought to maximize the use of one card with less visual exposure and possibility of loss of use of the card to third persons.

It is a further object of the protection sought to provide a card that is less visible itself as well as to the information on the card.

It is an object of the protection sought to provide an improved security card that will allow multiple uses of a single card without changing the outside dimensions of the card.

It is a further object of the protection sought to provide an improved security card that may be stored on person by attaching the card on a button under the clothing of the owner.

It is an object of the protection sought to provide an improved security card that has no or at least very limited resale value after it has been stolen in as much as the owner's name and number and the issuer cannot be delivered to the criminal purchaser.

An aspect of the invention is a security improved card that includes a semirigid plastic card member that includes a length, parallel lengthwise edges, a width, parallel widthwise edges, a front face, and a rear face. The security improved card further includes at least one strip on the rear face comprising means to encode a readable message in the strip. The security improved card also includes bending means along at least one straight line across a face of the card member parallel with either the lengthwise edges or the widthwise edges, said means providing reduced resistance to bending along said straight line to allow the card to be folded and cover the strip.

It is preferred that the bending means be along a single straight line parallel with the lengthwise edges. It is also preferred that the bending means be along a single straight line parallel with the widthwise edges. It is further preferred that the bending means be along two straight lines parallel with the lengthwise edges proximately dividing the card member in thirds. It is also preferred that the bending means includes a plurality of linear sections of depressions impressed along the line into the rear face of the card member and more preferred that the sections be in two rows adjacent to the line. It is also preferred that the bending means includes a slit through the card member along the line and a strip of flexible plastic film attached to the rear face of the card member bridging the slit and more preferred that the strip of flexible plastic film covers the entire rear face of the card member. It is further preferred that at least one edge of the card member be color coded to identify an issuer of the card and more preferred that the card member be a laminate and a center ply is color coded. It is also preferred that the card further includes an opening cut through the card member proximate an edge of the card member, the opening being of sufficient size and shape to allow a persons finger nail to engage the opening to pull the card from a wallet, and more preferred that the opening be of sufficient size to allow a shirt button to pass though the opening. It is further preferred that the card further includes a passage through the card member opening the opening through to said edge of the card member, wherein the passage is of a sufficient size and shape to allow a stitching of a button sewn on a garment to pass through the passage to the opening. It is also preferred that the card further includes a notch cut out of said edge of the card member proximate the opening and positioned to align with the opening when the card member is folded along the bending means. It is further preferred that the card member be colorless and transparent and the faces are of a non reflective surface with no permanent imprinting on the card member to visually identify an issuer, an owner or a card number, and the card further include means on at least one face of the card member to visually identify the issuer, the owner, and the card number in a manner that can be removed by the owner of the card. It is more preferred that said means include a removable adhesively attached colorless transparent sheet on one face of the card member with indicia to identify the issuer, the owner, and the card number. It is most preferred that the indicia be printed by means which allow the indicia to be read only when backed by an opaque sheet of a particular chosen color. It is also preferred that the card further includes a holograph that does not identify the issuer of the card, but does allow verification of the genuineness of the card.

Another aspect of the invention is a security improved card that includes a colorless and transparent semirigid plastic card member comprising a length, parallel lengthwise edges, a width, parallel widthwise edges, a non reflective front face, and a non reflective rear face. The card further includes identifying means that includes indicia on at least one face of the card member to visually identify an issuer, an owner, and a card number. The indicia is printed by means which allow the indicia to be read only when backed by an opaque sheet of a particular chosen color. The card further includes at least one strip on a face that includes means to encode a readable message in the strip.

It is preferred that the identifying means can be removed by the owner of the card. It is further preferred that said faces have no permanent imprinting to visually identify an issuer, an owner or a card number. It is also preferred that said identifying means include a removable adhesively attached colorless transparent sheet on one face of the card member with indicia to identify the issuer, the owner, and the card number. The balance of the preferred embodiments described herein above apply to the aspect described immediately herein above unless they are inconsistent.

Another aspect of the invention is a security improved card that includes a colorless and transparent semirigid plastic card member that includes a length, parallel lengthwise edges, a width, parallel widthwise edges, a non reflective front face, and a non reflective rear face, said faces having no permanent imprinting to visually identify an issuer, an owner or a card number. The security improved card further includes identifying means on at least one face of the card member to visually identify the issuer, the owner, and the card number in a manner that can be removed by the owner of the card. The security improved card further includes at least one strip on a face on which there is means to encode a readable message in the strip.

The preferred embodiments described herein above apply to the aspect described immediately herein above unless they are inconsistent. It is specifically preferred that the card further includes bending means along at least one straight line across a face of the card member parallel with either the lengthwise edges or the widthwise edges, said means providing reduced resistance to bending along said straight line to allow the card member to be folded and cover the strip.

Yet another aspect of the invention is a security improved card that includes a semirigid plastic card member that includes a length, parallel lengthwise edges, a width, parallel widthwise edges, a front face, and a rear face and at least one strip on the rear face that includes means to encode a readable message in the strip. The security improved card also includes an opening cut into the card member proximate an edge of the card member, the opening being of sufficient size and shape to allow a person's finger nail to engage the opening to pull the card from a wallet, and to allow a shirt button to pass though the opening.

Again the preferred embodiments described herein above apply to the aspect described immediately herein above unless they are inconsistent.

Another aspect of the invention is a security improved card that includes a colorless and transparent semirigid plastic card member that includes a length, parallel lengthwise edges, a width, parallel widthwise edges, a non reflective front face, and a non reflective rear face, preferably with no permanent imprinting on the card member to visually identify an issuer, an owner or a card number. The security improved card further includes identifying means on at least one face of the card member to visually identify the issuer, the owner, and the card number preferably in a manner that can be removed by the owner of the card, wherein said means can be visually read only when backed by an opaque sheet of a particular chosen color. The security improved card also includes at least one strip on the rear face that includes means to encode a readable message in the strip. The security improved card further includes bending means along a single straight line across a face of the card member parallel with the lengthwise edges, said means that includes a slit through the card member along the line and a strip of flexible plastic film attached over the entire rear face of the card member. The security improved card also includes an opening cut through the card member proximate and edge of the card member, the opening including a sufficient size and shape to allow a person's finger nail to engage the opening to pull the card from a wallet, and a shirt button sewn on a garment to pass through the opening.

DESCRIPTION OF PREFERRED EMBODIMENTS

Figure 1:
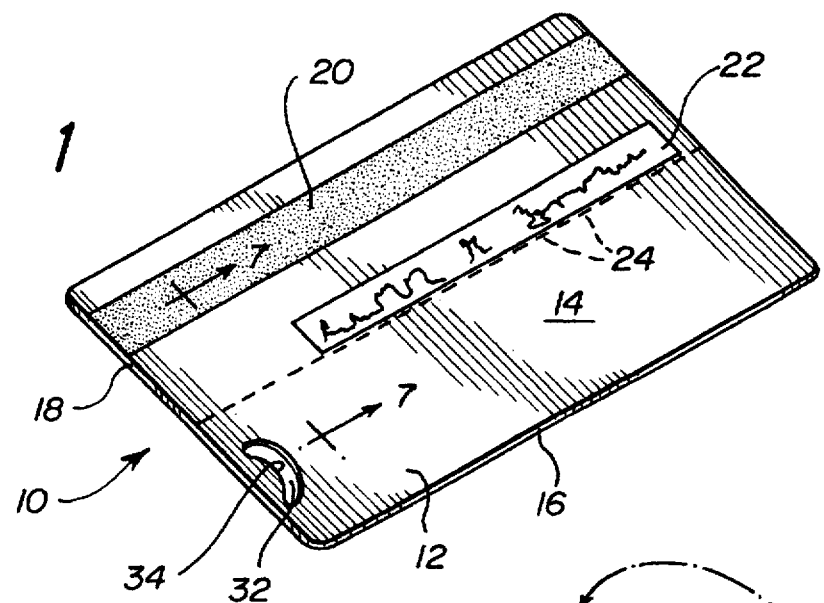
FIG. 1 is a front perspective view of a card of the present invention.
Figure 2:
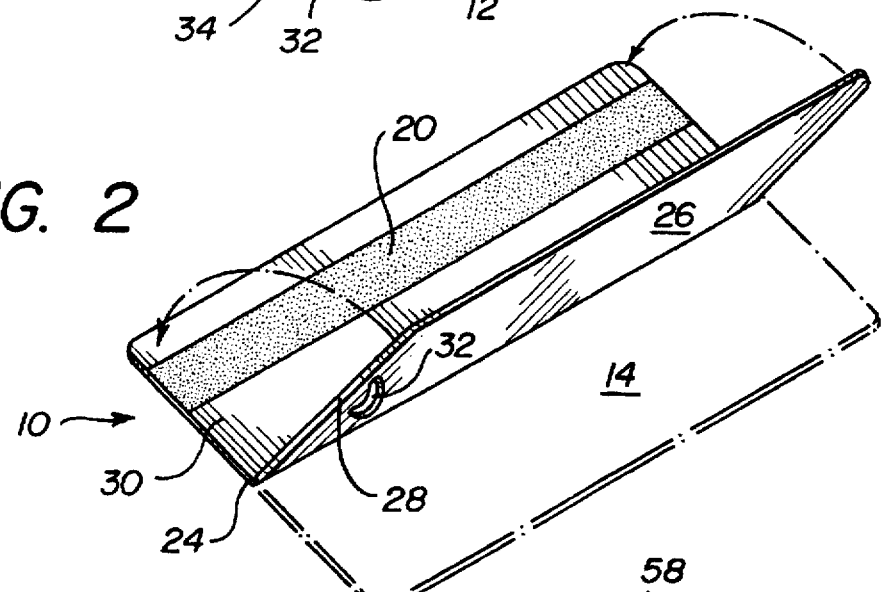
FIG. 2 is a perspective view of the card illustrated in FIG. 1 being folded in two for protection and storage.
Figure 7:
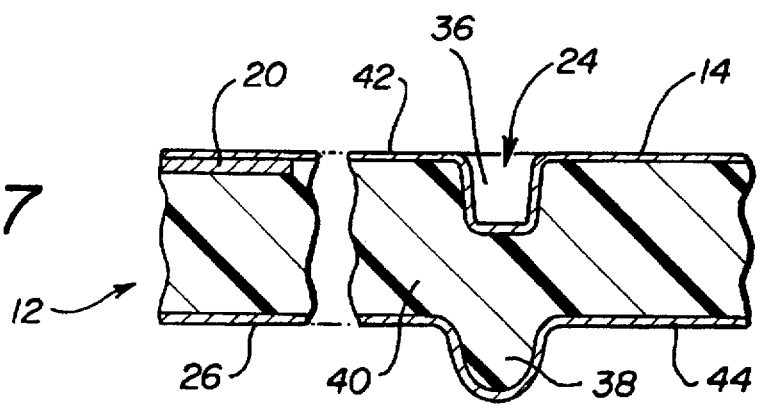
FIG. 7 is a cut away cross-sectional view taken along lines 7—7 of FIG. 1.

Improved card 10 of standard materials and construction is illustrated in FIGS. 1 and 2. Card member 12 is a rigid polyvinyl chloride sheet about thirty mils thick with a length of three and three eighths inches along edge 16 and a width of two and one eighth inches along edge 18. Card member 12 is actually a laminate with thin colorless transparent polymeric veneers on rear surface 14 and front service 26 as more fully illustrated in the cross sectional views of FIGS. 7 through 10. Magnetic strip 20 is a standard plastic strip containing ferrous metal particulars for encoding. Coating strip 22 provides a porous matte surface for signature of the card owner. As shown in FIG. 2, lower half of card member 12 is being folded over along bend line 24 to cover the rear surface of upper half 30 and magnetic strip 20. When card 10 is folded over in this fashion, it requires half the area for storage and is, more importantly, only about one inch wide which will fit into a large number of articles of clothing and pockets constructed for that purpose that the full card will not fit into. As shown in FIG. 7, bend line 24 consists of a multiplicity of "dashes" or, in the alternative, "underline marks" using the same equipment that is used to produce the raised letters on the lower half of the card. The raised letters and numbers are not shown in the drawings for clarity purposes. Line 24 shows dashes formed by impressing depressions 36 through rear surface 14 and a raised corresponding pattern out of surface 26. Cavities 36 are on the rear side and raised portions 38 are on the front side. The construction of card member 12 as shown in FIG. 7, is a rigid solid polyvinyl chloride sheet core 40 covered on the rear with transparent film 42 and on the front with transparent film 44. A standard interlayer of printing under the transparent films is not shown for clarity purposes. In prior cards, the core sheet is white showing a white edge and, as an improvement, core sheet 40' is colorless transparent and is so shaded in FIG. 8. Further, in the embodiment illustrated in FIG. 8, edge 65 is coated silver. Any color may be used to identify the type of card, issuer of the card, or the like. Coloring of the edge of the card may be accomplished by any method. Further, sections of the card may be colored, such as the entire edge in color red, except for section 75, on card 68 shown in FIG. 4, which acts to identify the location of nail access slot 76 from the edge of the card as well as the type or issuer of the card. Nail access crescent shaped slot 76 is cut through card member 12 proximate the lower section of edge 18. When a group of cards are tightly packed in, for example, a wallet, card 10 can be easily withdrawn by catching edge 34 of crescent-shaped slot 32 and pulling out the chosen card while leaving the balance of the cards in the wallet. While slot 32 is cut entirely through card 12, it should be clear that hollow or groove may be formed into the surface of the card with an edge catchable with a finger nail, without the necessity of cutting through the card. An additional advantage of the slot or hollow is to provide a physical means of orienting the card to pass it through a reader. This orientation is particularly important for cards with multiple magnetic strips.

Figure 3:
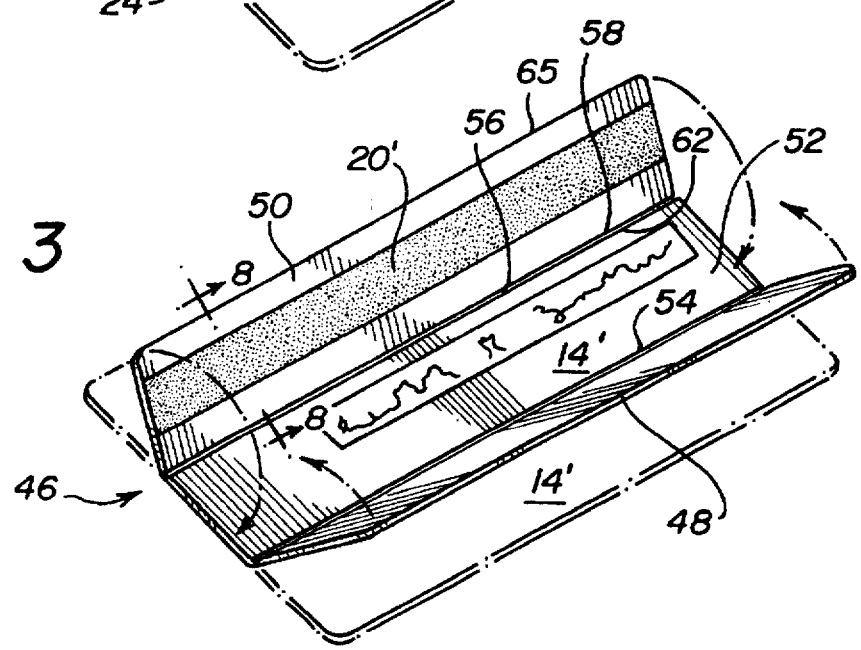
FIG. 3 is a perspective view of a second embodiment of the invention showing a trifold embodiment.
Figure 8:
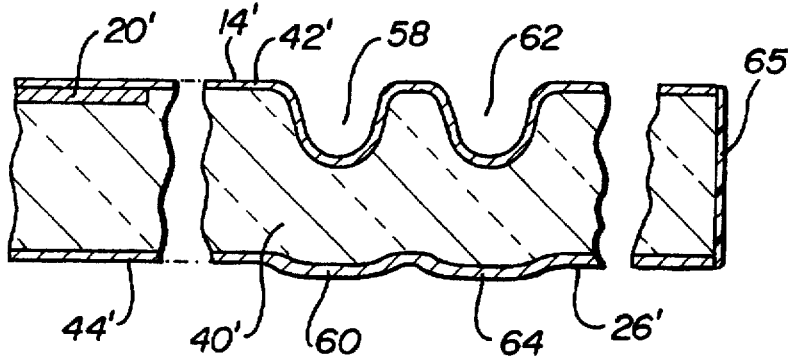
FIG. 8 is a cut away cross-sectional view taken along lines 8—8 of FIG. 3.

Improved card 46 is illustrated in FIGS. 3 and 8 wherein the card is capable of being folded in two places into thirds with the resulting card being less than ¾ inch wide, which will easily fit into a hidden pocket in a waist belt or into a key chain fob or even into a guard dog collar. Lower third section 48 folds along line 54 over upper section 50 which is folded downwardly along line 56 against surface 14' to reduce the size of the card. The edge color of this card is silver achieved by coating 65 applied to the card edge as shown in FIG. 8. Fold line 56 is produced by a pair of parallel troughs 58 and 62 extending the length of card 46. These troughs are produced by impressing them into the thermos plastic laminate against a firm base producing only minimal convex raised portions 60 and 64 on surface 26'. The other elements show in FIGS. 3 and 8 with a "'''" designation indicate that they are similar to that of the elements shown and described in FIGS. 1, 2, and 7.

Figure 4:
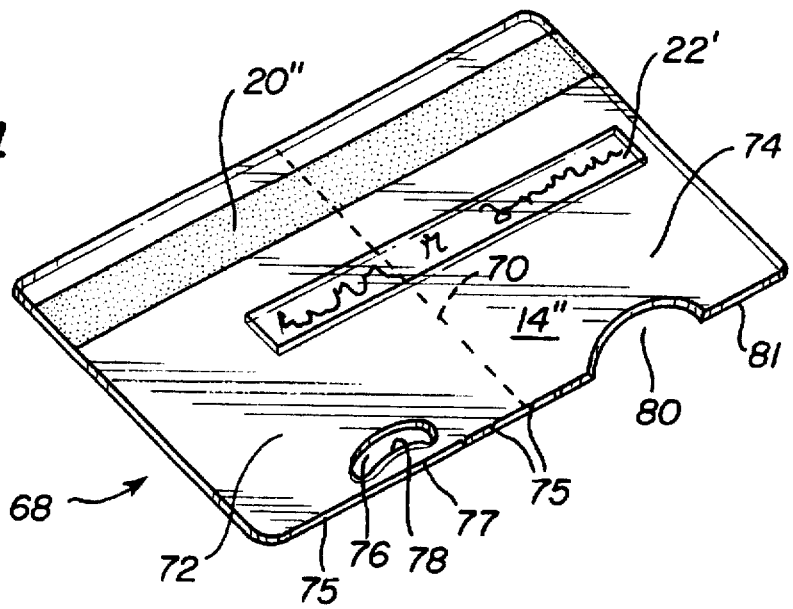
FIG. 4 is a perspective view of a third embodiment of the invention.

In FIG. 4, transparent and colorless card 68 is illustrated wherein bend line 70 divides the card in half laterally so that left section 72 folds over and abuts right section 74, again hiding magnetic strip 20". Bend line 70 is constructed as single groove 58 or 62, at least as it passes strip 20", in order to disrupt the integrity of the strip as little as possible. In this embodiment, the card is now less than one and three-quarters inch by two and one-eighth inches and will easily fit into a watch pocket or change pocket in trousers or in a instep pocket in sneakers. Further, this size is much easier to palm and thus prevent persons from seeing your card number and name on the face of the card. Even if it is not palmed, an unscrupulous person will only be able to see one half of the imprinted information on the front face. In card 68 nail access slot 76 is cut through the middle of section 72 close to edge section 77 along the lengthwise edge. When removing card 68 from a tightly packed group, the nail will easily engage edge 78 to pull the card free. Notch 80 is provided in section 74 out of edge section 81 which, when the card is folded, allows easy and ready access to nail access slot 76. Opening 76 is large enough to allow a shirt button to be inserted through the opening so that the card can be hung on a shirt, which is particularly effective for young children. The card can be hung on the inside of the front seam of the shirt and be completely hidden from view. Edge section 77 is colorless, while the balance of that edge, sections 75 and 81 are colored red, to allow a person to locate opening 76 and identify the card when the card is in a tightly packed bundle. The other elements show in FIG. 4 with a "'''" designation indicate that they are similar to that of the elements shown and described in FIGS. 1 and 2.

Figure 5:
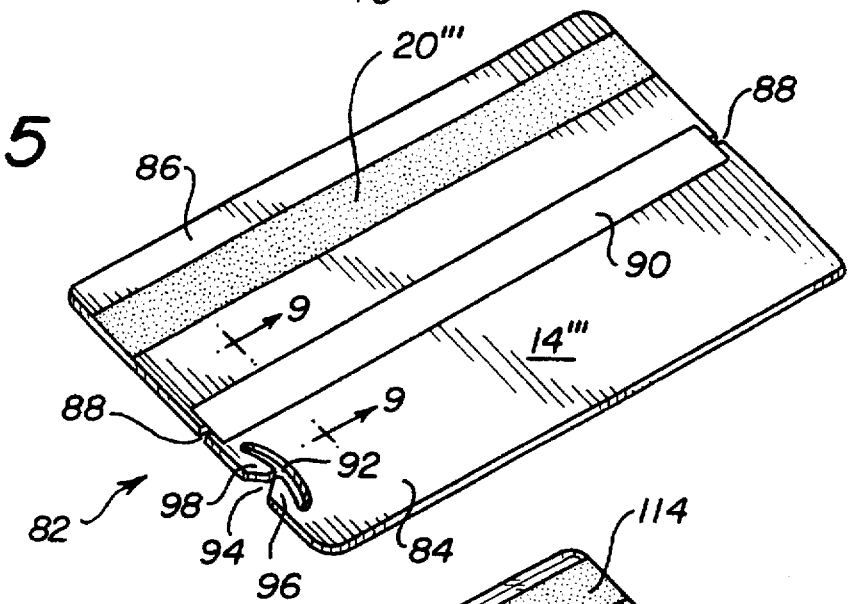
FIG. 5 is a perspective view of a fourth embodiment of the invention.
Figure 9:
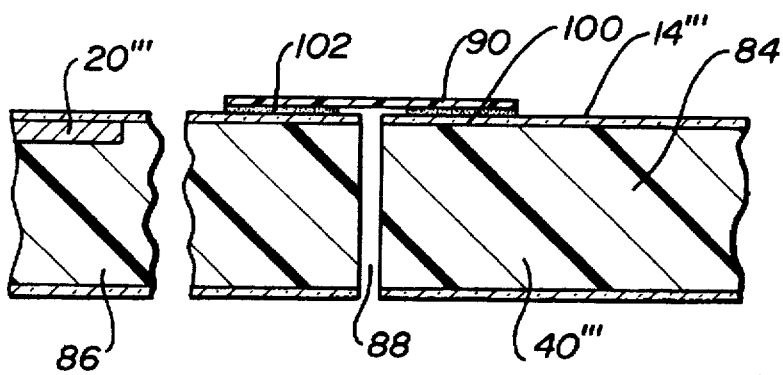
FIG. 9 is a partially cut away cross sectional view taken along lines 9—9 of FIG. 5.

Card 82 is illustrated in FIGS. 5 and 9 wherein bend line 88 is a cut all the way through the card stock with flexible tape 90 providing a ready hinge to hold the card together. Adhesive lines 100 and 102 on opposite sides of slit 88 provide permanent adhesion of tape 90 to the card. In this embodiment, the lower section 84 folds against upper section 86 to form a folded shape similar to that of card 10. Nail access slot 92 is cut close to the end edge of lower section 84. Triangular opening 84 is cut from the edge into slot 92 forming sections 92 and 98 which catch and hold any button shank forced through that opening. In this embodiment, the card can be easily hung on any button by forcing opening 84 against the button shank and allowing the shank to push through into nail access slot 92. Since the abutting edges of 96 and 98 are close together, the button is caught and is not inadvertently disengaged from the card.

Figure 6:
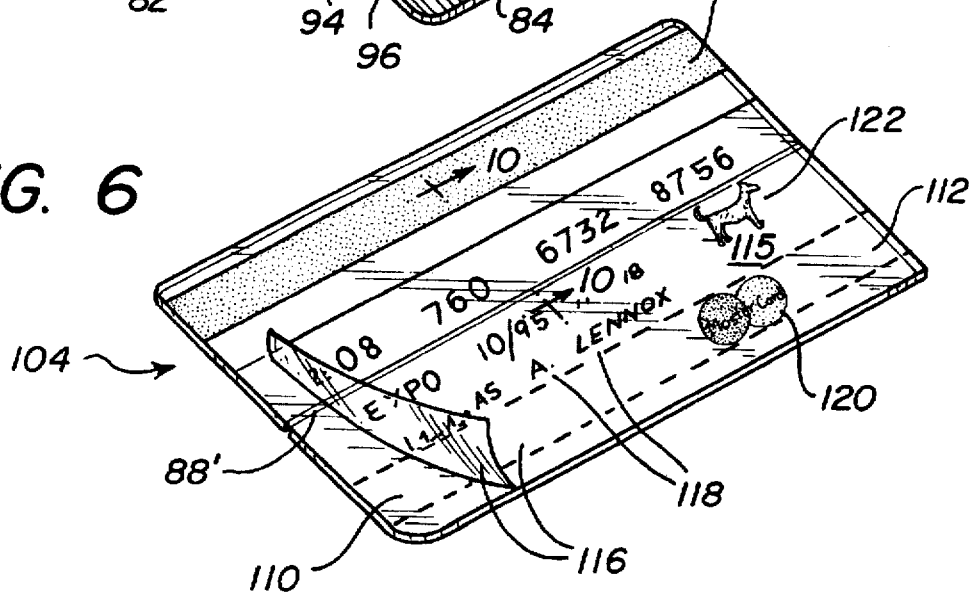
FIG. 6 is a perspective view of a fifth embodiment of the invention.
Figure 10:
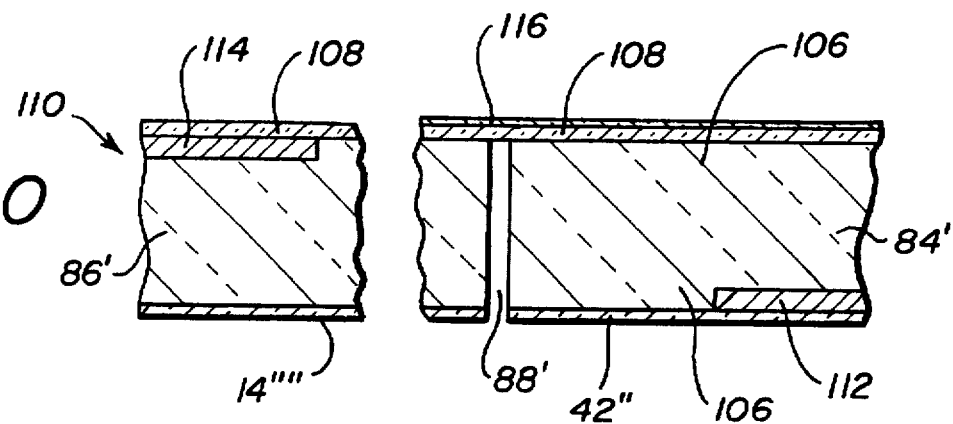
FIG. 10 is a partially cut away cross sectional view taken along lines 10—10 of FIG. 6.

Improved card 104 is illustrated in FIGS. 6 and 10. The hinge is formed by ten mil colorless transparent plasticized polyvinyl chloride plastic layer 108 which is laminated over slot 88' using the standard process of producing cards. Slot 88' separates sections 84' and 86' of the card. Film 116 replaces the colorless transparent films 42 or 42' and is chosen to provide sufficient flexibility for easy non hazing bending of the card. Card 104 is constructed to be almost invisible when lying on the ground. This embodiment is a further improvement to prevent unscrupulous persons from wrongfully using the card. Card stock 110 is constructed of semirigid colorless transparent polyvinyl chloride plastic core sheets 108 and 42" laminated on the front and back surfaces respectively. The perspective view of card 104 in FIG. 6 is of the top surface, and the cross-sectional view in FIG. 10 is different from FIGS. 7 through 10 in that these prior figures show the rear of the card on the top of each drawing while FIG. 10 is reversed. Card 104 is equipped with magnetic strip 114 on front surface 115 and magnetic strip 112 on rear surface 42". Strip 112 is coded in a standard fashion to identify the consumer and the number for use as a standard credit card, while strip 114 on the front of the card is coded by the consumer or a locksmith to allow the card owner to open the owners outside door to the owner's residence. Electronically encodable strips may be added along the short edges of both sides of the card so that it is possible to encode up to eight separate codes on a single card. Code readers would have to differentiate between the various codes reading them singly or in combination, but entry to the code could be limited using standard security systems. Such multiple uses of a card would not be safe without the other modifications of this embodiment. The only identifying printing on card %04 is half tone print of the card number, card owner, and type/issuer of the card on colorless transparent adhesively attached overlay cellulose acetate film 116. The half tone printing is achieved by printing a series of dots spaced apart so that it can only be read if the card is placed on a white or other contrasting colored background. This printing makes it nearly impossible for a person to read the number and the owner's name from any distance. It is further preferred that even these "temporary" numbers omit the code numbers identifying the issuer. The overlay sheet 116 is used temporarily by the owner until the use has been tested after which the sheet is removed leaving an essentially unidentifiable card. A person finding the "blank" card could not use it as the owner would not be known and even the type of card would not be known. An unscrupulous person trying to use the card would have to guess if it was a MASTERCARD® card, a VISA® card, or whatever. If the guess were wrong the card would be confiscated and the user prosecuted. While an unscrupulous person could go to equipment to read the code, the delay allows the owner who lost the card additional time not normally available to notify the issuer and stop the authorization to use the card. A lost unmarked card of the present invention is much more difficult to market to third parties, as they must "trust" the integrity of the criminal selling the lost card that he has correctly electronically confirmed the identity of the card. A number of alternative temporary marking systems may be used, such as printing the information on the card with non permanent ink that will either shortly wear or drop off, or it may be washed off at a time of the owner's choosing. Holograph 122 on card 110 does not identify the issuer and is chosen from a group of holographs that all the issuers use. The holograph may still be used to authenticate the card as non counterfeit. The owner can identify a particular card from other cards in the owner's wallet as each card will have a different holograph. As an alternative to the holograph system, the owner can personally place a mark on the card to differentiate from other cards the owner carries. Card 110 has matte surfaces which makes the card difficult to see when lying on many ground surfaces. This also tends to delay someone from picking up a lost card and allows the owner to contact the issuer. If preferred, a signature of the owner can be written anywhere on the card. Without the owner's name and issuer of the card, an unauthorized person still could not use the card, particularly if the signature is not very legible. The elements shown in FIGS. 6 and 10 with "'", "''", or "'''" designations indicate that they are similar to that of the elements shown in prior figures.

While this invention has been described with reference to specific embodiments disclosed herein, it is not confined to the details set forth and the patent is intended to include modifications and changes which may come within and extend from the following claims.

I claim:

1. A security improved card comprising:
   (a) a semirigid plastic card member comprising a length, parallel lengthwise edges, a width, parallel widthwise edges, a front face, and a rear face,
   (b) at least one strip on the rear face comprising means to encode a readable message in the strip, and
   (c) bending means permanently and integrally formed with the card member and disposed along at least one straight line across a face of the card member parallel with at least one edge, said means providing reduced resistance to bending along said straight line to allow the card to be folded over and cover the strip repeatedly.

2. The card of claim 1 wherein the bending means is along a single straight line parallel with the lengthwise edges.

3. The card of claim 1 wherein the bending means is along a single straight line parallel with the widthwise edges.

4. The card of claim 1 wherein the bending means is along two straight lines parallel with the lengthwise edges proximately dividing the card member in thirds.

5. The card of claim 1 wherein the bending means comprises a plurality of linear sections of depressions impressed along the line into the rear face of the card member.

6. The card of claim 1 wherein the bending means comprises a plurality of linear sections of depressions impressed into the rear face of the card member, the sections being in two rows adjacent to the line.

7. The card of claim 1 wherein a slit disposed in the card member along the line, wherein the card member further comprises a layer permanently attached to at least one face and covering the slit, and wherein the bending means comprises a portion of the layer extending over the slit.

8. The card of claim 7 wherein the layer covers the entire rear face of the card member.

9. The card of claim 1 further comprising a distinct edge layer disposed along at least one edge which is color coded to identify the issuer of the card.

10. The card of claim 1 further comprising an opening cut into or through the card member proximate an edge of the card member, the opening being of sufficient size and shape to allow a person's finger nail to engage the opening to pull the card from a wallet.

11. The card of claim 10 wherein the opening is cut through the card and is of sufficient size to allow a shirt button to pass though the opening.

12. The card of claim 10 further comprising a passage through the card member opening the opening through to said edge of the card member, wherein the passage is of a sufficient size and shape to allow a stitching of a button sewn on a garment to pass through the passage to the opening.

13. The card of claim 10 further comprising a notch cut out of said edge of the card member proximate the opening and positioned to align with the opening when the card member is folded along the bending means.

14. The card of claim 1 wherein the card member is colorless and transparent and the faces are of a non-reflective surface with no permanent imprinting on the card member to visually identify an issuer, an owner or a card number, and the card further comprises means on at least one face of the card member to visually identify the issuer, the owner, and the card number in a manner that can be removed by the owner of the card.

15. The card of claim 14 wherein said means comprises a removable adhesively attached colorless transparent sheet on one face of the card member with indicia to identify the issuer, the owner, and the card number.

16. The card of claim 15 wherein the indicia is printed by means which allow the indicia to be read only when backed by an opaque sheet of a particular chosen color.

17. The card of claim 14 further comprising a holograph that does not identify the issuer of the card, but does allow verification of the genuineness of the card.

18. A security improved card comprising:
   (a) a colorless and transparent semirigid plastic card member comprising a length, parallel lengthwise edges, a width, parallel widthwise edges, a non-reflective front face, and a non-reflective rear face,
   (b) identifying means comprising indicia on at least one face of the card member to visually identify an issuer, an owner, and a card number,
   wherein the indicia can be read only when backed by an opaque sheet of a particular chosen color, and
   (c) at least one strip on a face comprising means to encode a readable message in the strip.

19. The card of claim 18 wherein the identifying means can be removed by an owner of the card.

20. The card of claim 19 wherein said faces having no permanent imprinting to visually identify the issuer, the owner or the card number.

21. The card of claim 19 wherein said identifying means comprises a removable adhesively attached colorless transparent sheet on one face of the card member with indicia to identify the issuer, the owner, and the card number.

22. The card of claim 18 further comprising a holograph that does not identify the issuer of the card, but does allow verification of the genuineness of the card.

23. The card of claim 18 further comprising bending means along at least one straight line across a face of the card member parallel with at least one edge, said means providing reduced resistance to bending along said straight line to allow the card member to be folded and cover the strip.

24. The card of claim 18 further comprising an opening cut into the card member proximate an edge of the card member, the opening being of sufficient size and shape to allow a person's finger nail to engage the opening to pull the card from a wallet.

25. The card of claim 24 wherein the opening is of sufficient size to allow a shirt button to pass though the opening.

26. A security improved card comprising:
   (a) a semirigid plastic card member comprising a length, parallel lengthwise edges, a width, parallel widthwise edges, a front face, and a rear face, (b) at least one strip on the rear face comprising means to encode a readable message in the strip, and (c) a crescent-shaped opening cut into the card member proximate an edge of the card member, the opening being of sufficient size and shape to allow:

(i) a person's finger nail to engage the opening to pull the card from a wallet, and (ii) a shirt button to pass though the opening.

27. The card of claim 26 further comprising a passage through the card member opening the opening through to said edge of the card member, wherein the pass-sage is of a sufficient size and shape to allow a stitching of a button sewn on a garment to pass through the passage to the opening.

28. The card of claim 26 further comprising bending means along at least one straight line across a face of the card member parallel with at least one edge, said means providing reduced resistance to bending along said straight line to allow the card member to be folded and cover the strip.

29. The card of claim 28 further comprising a notch cut out of said edge of the card member proximate the opening and positioned to align with the opening when the card member is folded along the bending means.

30. The card of claim 26 wherein a section of said edge is color coded to identify the location of the opening.

31. The card of claim 26 wherein the card member is colorless and transparent and the faces are of a non reflective surface with no permanent imprinting on the card member to visually identify an issuer, an owner or a card number, and the card further comprises means on at least one face of the card member to visually identify the issuer, the owner, and the card number in a manner that can be removed by the owner of the card.

32. A security improved card comprising:

(a) a colorless and transparent semirigid plastic card member comprising a length, parallel lengthwise edges, a width, parallel widthwise edges, a non reflective front face, and a non reflective rear face, (b) identifying means on at least one face of the card member to visually identify an issuer, an owner, and a card number, wherein said means can be visually read only when backed by an opaque sheet of a particular chosen color, (c) at least one strip on the rear face comprising means to encode a readable message in the strip, (d) bending means along a single straight line across a face of the card member parallel with the lengthwise edges, said means comprising a slit through the card member along the line and a strip of flexible plastic film attached over the entire rear face of the card member, and (e) an opening cut through the card member proximate and edge of the card member, the opening comprising a sufficient size and shape to allow:

(i) a person's finger nail to engage the opening to pull the card from a wallet, and (ii) a shirt button sewn on a garment to pass through the opening.

* * * * *